United States Patent
Inoue et al.

(10) Patent No.: US 9,728,417 B2
(45) Date of Patent: Aug. 8, 2017

(54) METHOD FOR PROCESSING BASE BODY TO BE PROCESSED

(71) Applicant: TOKYO ELECTRON LIMITED, Tokyo (JP)

(72) Inventors: Masaki Inoue, Albany, NY (US); Toshihisa Ozu, Hwaseong (KR); Takehiro Tanikawa, Miyagi (JP); Jun Yoshikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/371,584

(22) PCT Filed: Nov. 9, 2012

(86) PCT No.: PCT/JP2012/079140
§ 371 (c)(1),
(2) Date: Jul. 10, 2014

(87) PCT Pub. No.: WO2013/111420
PCT Pub. Date: Aug. 1, 2013

(65) Prior Publication Data
US 2015/0017811 A1    Jan. 15, 2015

(30) Foreign Application Priority Data

Jan. 25, 2012  (JP) .................................. 2012-013360

(51) Int. Cl.
*H01L 21/302*    (2006.01)
*H01L 21/461*    (2006.01)
(Continued)

(52) U.S. Cl.
CPC .... *H01L 21/3065* (2013.01); *H01L 21/30621* (2013.01); *H01L 21/31116* (2013.01);
(Continued)

(58) Field of Classification Search
None
See application file for complete search history.

(56) References Cited

U.S. PATENT DOCUMENTS 6,376,888 B1 *  4/2002  Tsunashima et al. ......... 257/407
6,428,716 B1 *  8/2002  Demmin ........... H01L 21/31116
                                                    216/108

(Continued)

FOREIGN PATENT DOCUMENTS

JP    11-204455 A     7/1999
JP    2006-253222 A   9/2006
(Continued)

OTHER PUBLICATIONS

International Search Report mailed Dec. 25, 2012 in PCT/JP2012/079140.

*Primary Examiner* — Stephanie Duclair
(74) *Attorney, Agent, or Firm* — Rothwell, Figg, Ernst & Manbeck, P.C.

(57) ABSTRACT

An exemplary embodiment provides a method which etches a second layer in a base body to be processed having a first layer containing Ni and Si and a second layer containing Si and N which are exposed to a surface thereof. The method according to the exemplary embodiment includes (a) preparing a base body to be processed in a processing chamber, and (b) supplying a first processing gas which contains carbon and fluorine but does not contain oxygen into the processing chamber and generating plasma in the processing chamber.

8 Claims, 4 Drawing Sheets

(51) Int. Cl.

| | |
|---|---|
| *H01B 13/00* | (2006.01) |
| *B44C 1/22* | (2006.01) |
| *C03C 15/00* | (2006.01) |
| *C03C 25/68* | (2006.01) |
| *C23F 1/00* | (2006.01) |
| *H01L 21/3065* | (2006.01) |
| *H01L 21/306* | (2006.01) |
| *H01L 21/311* | (2006.01) |
| *H01L 29/49* | (2006.01) |
| *H01L 21/3213* | (2006.01) |
| *H01L 29/66* | (2006.01) |
| *H01J 37/32* | (2006.01) |

(52) U.S. Cl.
CPC ........ *H01L 29/4916* (2013.01); *H01L 29/665* (2013.01); *H01L 29/6653* (2013.01); *H01J 37/32192* (2013.01); *H01L 21/32136* (2013.01); *H01L 21/32137* (2013.01); *H01L 29/6656* (2013.01); *H01L 29/6659* (2013.01)

(56) References Cited

U.S. PATENT DOCUMENTS

| | | | |
|---|---|---|---|
| 6,706,640 B1 * | 3/2004 | Tsai .................. H01L 21/28518 | |
| | | | 257/E21.165 |
| 7,390,754 B2 * | 6/2008 | Chang et al. ................. 438/745 | |
| 8,399,360 B1 * | 3/2013 | Miller et al. .................. 438/710 | |
| 2004/0168705 A1 * | 9/2004 | Sun .................. H01L 21/76814 | |
| | | | 134/1.2 |
| 2006/0172535 A1 * | 8/2006 | Allen ................ H01L 21/31116 | |
| | | | 438/682 |
| 2006/0205216 A1 * | 9/2006 | Sato ............................ 438/689 | |

FOREIGN PATENT DOCUMENTS

| | | |
|---|---|---|
| JP | 2006-261216 A | 9/2006 |
| JP | 2006-339327 A | 12/2006 |
| JP | 2008-124407 A | 5/2008 |
| JP | 2010-171327 A | 8/2010 |
| JP | 2011-18719 A | 1/2011 |

* cited by examiner

US 9,728,417 B2

METHOD FOR PROCESSING BASE BODY TO BE PROCESSED

CROSS REFERENCE TO RELATED APPLICATION

This application is a 35 U.S.C. 371 National Phase Entry Application from PCT/JP2012/079140, filed Nov. 9, 2012, which claims priority to and the benefit of Japanese Patent Application No. 2012-013360, filed Jan. 25, 2012, the disclosures of which are incorporated herein in their entirety by reference.

TECHNICAL FIELD

Several aspects of the present invention relate to a method for processing a base body to be processed.

BACKGROUND ART

The following Patent Document 1 discloses a method for processing a base body to be processed. The method disclosed in Patent Document 1 relates to a method for manufacturing an MOS transistor. The method disclosed in Patent document 1 includes (a) patterning a silicon oxide film and a polysilicon film which are formed on a semiconductor substrate to form a gate electrode, (b) implanting ion onto the semiconductor substrate using the gate electrode as a mask to form a lightly diffused region, (c) sequentially forming a first side wall spacer layer and a second side wall spacer layer on a side wall of the gate electrode, (d) implanting ion onto the semiconductor substrate using the side wall spacer layers as masks to form a highly diffused region, and (e) forming a nickel silicide layer in the gate electrode and the highly diffused region.

In the method for manufacturing an MOS transistor, the first side wall spacer layer may be formed of silicon oxide and the second side wall spacer layer may be formed of silicon nitride in some cases. Further, after forming the nickel silicide layer, the second side wall spacer layer may be removed by dry etching. In order to dry-etch the second side wall spacer layer, generally, mixture gas containing gas (CF based gas) which includes carbon and fluorine and oxygen gas is used.

CITATION LIST

Patent Literature

Patent Document 1: Japanese Patent Application Laid-Open No. 2006-339327

SUMMARY OF INVENTION

Problems to be Solved by the Invention

Like the above-described method for manufacturing an MOS transistor, in a base body to be processed having a layer containing nickel silicide and a layer containing silicon nitride on a surface thereof, when the layer containing silicon nitride is removed by dry etching, a residue derived from Ni which is included in the nickel silicide layer may be deposited on the base body to be processed in some cases. Therefore, in the relevant technical field, when the dry etching is applied to a layer containing silicon nitride, it is considered to suppress the generation of the residue derived from Ni which is included in the nickel silicide.

Means to Solve the Problems

A method for processing a base body to be processed according to an aspect of the present invention includes (a) preparing a base body to be processed including a first layer containing nickel silicide and a second layer containing silicon nitride which are exposed to a surface thereof, in a processing chamber, and (b) etching the second layer, which includes supplying a first processing gas which contains carbon and fluorine but does not contain oxygen into the processing chamber and generating plasma in the processing chamber.

In the base body to be processed having a silicon nitride layer and a nickel silicide layer on its surface, when the silicon nitride layer is removed by dry etching, generally, mixture gas containing gas containing carbon and fluorine and oxygen gas is used in order to selectively etch the silicon nitride layer with respect to the nickel silicide layer. However, in the dry etching using the mixture gas, a residue containing Ni may be generated on the base body to be processed in some cases. The residue is supposed to be generated by the mechanism which will be described below. That is, nickel silicide is etched so that Ni is combined with a carbon radical and an oxygen radical, which results in generating $Ni(CO)_4$. Further, $Ni(CO)_4$ is disassociated to react with oxygen gas and thus $[Ni(CO)_x]_n$ is generated and $[Ni(CO)_x]_n$ is deposited on the base body to be processed as a residue. In the meantime, x and n are an integer of one or larger.

In the meantime, according to the method for processing a base body to be processed according to an aspect, oxygen is not contained in the first processing gas which is supplied into the processing chamber so that it is possible to suppress the residue containing Ni from being generated.

In one exemplary embodiment, the first processing gas may further contain hydrogen. Hydrogen is combined with fluorine in the first processing gas, which may contribute to suppressing silicon from being excessively etched. Hydrogen may be supplied as $H_2$ gas.

According to one exemplary embodiment, the method for processing a base body to be processed may further include removing a residue from the base body to be processed which is etched in the etching and the removing includes supplying a second processing gas which contains nitrogen and hydrogen but does not contain oxygen into the processing chamber and generating plasma in the processing chamber.

After the etching using the first processing gas as described above, a residue (a residue containing carbon and fluorine) derived from carbon and fluorine which are contained in the first processing gas may be deposited on the base body to be processed. Oxygen is not included in the second processing gas which is supplied into the processing chamber in order to remove the residue containing carbon and fluorine so that it is possible to suppress the residue containing Ni from being generated.

In one exemplary embodiment, after the etching, a removing process of the residue containing carbon and fluorine may be performed in the same processing chamber without withdrawing the base body to be processed from the processing chamber. According to this exemplary embodiment, it is possible to suppress oxygen from entering the processing chamber. Accordingly, it is possible to suppress the residue containing Ni from being generated.

According to one exemplary embodiment, the second processing gas may include $H_2$ gas and $N_2$ gas. A radical which is produced from the $H_2$ gas is combined with fluorine in the residue containing carbon and fluorine and a radical which is produced from the $N_2$ gas is combined with carbon in the residue containing carbon and fluorine. Accordingly, according to this exemplary embodiment, the residue containing carbon and fluorine may be efficiently removed.

A method for processing a base body to be processed according to another aspect of the present invention includes (a) preparing a base body to be processed including a first layer containing nickel silicide and a second layer containing silicon nitride which are exposed to a surface thereof, in a processing chamber, (b) oxidizing a surface of the first layer in the processing chamber, and (c) etching the second layer, by supplying a first processing gas containing carbon and fluorine into the processing chamber and generating plasma in the processing chamber. According to the method for processing a base body to be processed according to another aspect, before etching the second layer, the surface of the first layer is oxidized so that the residue derived from Ni which is contained in the first layer is suppressed from being generated when the second layer is etched.

Effect of the Invention

As described above, according to several aspects and several exemplary embodiments of the present invention, a method for processing a base body to be processed, which may suppress the generation of a residue derived from Ni which is included in nickel silicide when the dry etching is applied to a layer containing silicon nitride, is provided.

DETAILED DESCRIPTION

Figure 1:
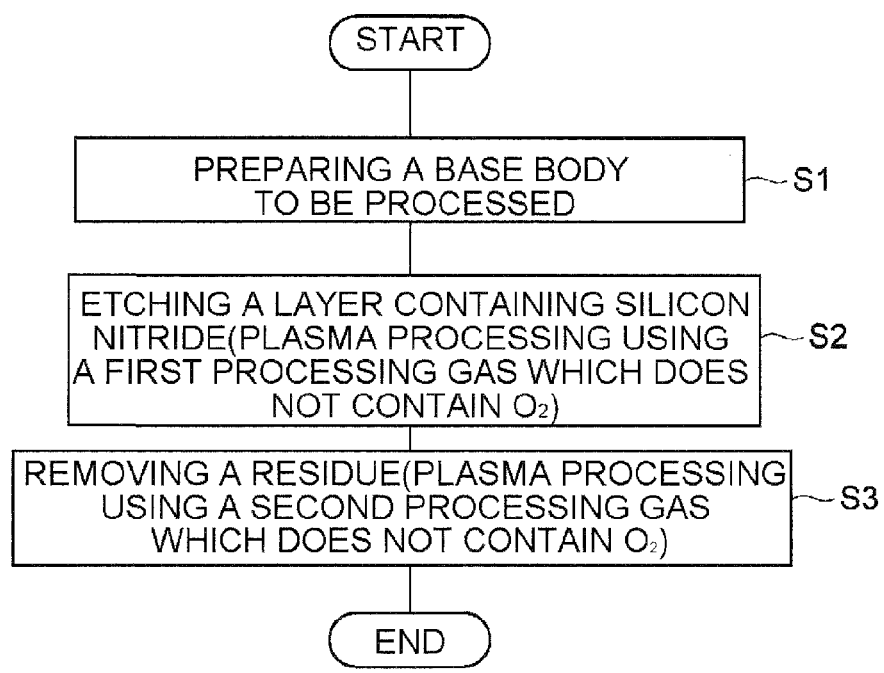
FIG. 1 is a flowchart illustrating a method for processing a base body to be processed according to an exemplary embodiment.

Hereinafter, several exemplary embodiments will be described in detail with reference to the drawings. FIG. 1 is a flowchart illustrating a method for processing a base body to be processed according to an exemplary embodiment. As illustrated in FIG. 1, in the method for processing a base body to be processed according to an exemplary embodiment, first, a base body W to be processed is prepared in step S1. The base body W to be processed includes a layer (a first layer) containing nickel silicide (NiSi) and a layer (a second layer) containing silicon nitride (SiN). The layer containing nickel silicide and the layer containing silicon nitride are exposed onto a surface of the base body W to be processed.

Figure 2:
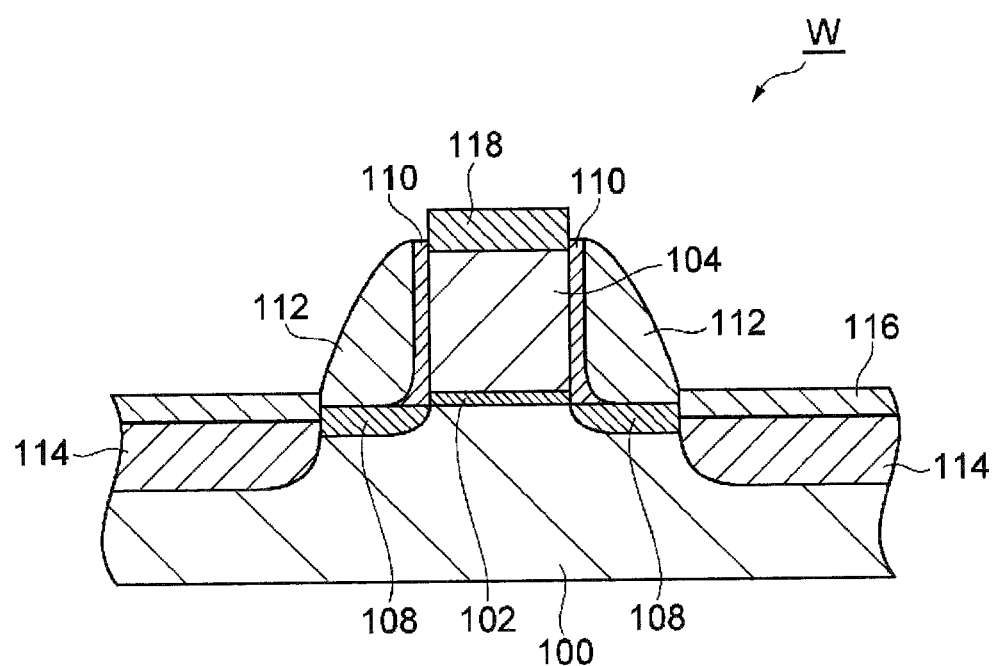
FIG. 2 is a view illustrating an example of a base body to be processed to which the processing method illustrated in FIG. 1 is applied.

FIG. 2 is a view illustrating an example of a base body to be processed to which the processing method illustrated in FIG. 1 is applied. In FIG. 2, an example of the base body to be processed which is produced in an intermediate process of the method for manufacturing an MOS transistor is illustrated. Hereinafter, a method for processing a base body to be processed according to an exemplary embodiment will be described for the base body to be processed illustrated in FIG. 2 as an example.

The base body to be processed illustrated in FIG. 2 includes a substrate 100, an insulating film 102, a gate electrode 104, a lightly diffused region 108, a first side wall spacer layer 110, a second side wall spacer layer 112, a highly diffused region 114, and nickel silicide layers 116 and 118.

The substrate 100 is, for example, a first conductive type (any one of a p type and an n type) Si substrate. The insulating film 102 is formed on the substrate 100 and the gate electrode 104 is formed on the insulating film 102. The insulating film 102 is, for example, a $SiO_2$ layer. The gate electrode 104 is, for example, formed of polysilicon. The nickel silicide layer 118 is formed on the gate electrode 104.

The first side wall spacer layer 110 and the second side wall spacer layer 112 are sequentially formed on each of a pair of side walls of the gate electrode 104. That is, the first side wall spacer layer 110 is formed to be in contact with the side wall of the gate electrode 104 and formed between the side wall of the gate electrode 104 and the second side wall spacer layer 112. The first side wall spacer layer 110 is formed of $SiO_2$ and the second side wall spacer layer 112 is formed of silicon nitride (SiN).

On the substrate 100, the lightly diffused region 108 is formed below the first side wall spacer layer 110 and the second side wall spacer layer 112. The lightly diffused region 108 is formed in a predetermined depth from the substrate 100 from a surface of the substrate 100. The lightly diffused region 108 has a second conductive type (the other one of the p type and the n type).

The highly diffused region 114 is formed at a side of the lightly diffused region 108 in the substrate 100. The highly diffused region 114 has a second conductive type (the other one of the p type and the n type). In the highly diffused region 114, a second conductive type impurity is diffused with a higher concentration than that of the second conductive type impurity in the lightly diffused region 108. The nickel silicide layer 116 is formed on the highly diffused region 114.

The base body W to be processed illustrated in FIG. 2 may be created as described below. First, in step (a), a $SiO_2$ layer and a polysilicon layer are formed on the substrate 100, for example, by a chemical vapor deposition (CVD) method. Next, in step (b), the $SiO_2$ layer and the polysilicon layer which are formed in step (a) are patterned by photolithography and etching to form an insulating film 102 and a gate electrode 104.

Next, in step (c), a second conductive type ion is diffused into the substrate 100 using the gate electrode 104 as a mask to form a lightly diffused region 108. Next, in step (d), a $SiO_2$ layer is formed, for example, by a CVD method so as to cover a surface of a product created in step (c) and the $SiO_2$ layer is etched back to form a first side wall spacer layer 110.

Next, in step (e), a SiN layer is formed, for example, by a CVD method so as to cover a surface of a product created in step (d) and the SiN layer is etched back to form a second side wall spacer layer 112.

Next, in step (f), a second conductive type ion is diffused into the substrate 100 using the second side wall spacer layer 112 as a mask to form a highly diffused region 114. Next, in step (g), a Ni layer is formed by, for example, a sputtering method so as to cover a surface of a product created in step (f) and an annealing process is performed to form nickel silicide layers 116 and 118. And then an unprocessed Ni layer is removed to obtain a base body W to be processed. In the base body W to be processed which is created as described above, the second side wall spacer layer 112 which includes silicon nitride is exposed to the surface and the nickel silicide layers 116 and 118 are exposed to the surface.

Figure 3:
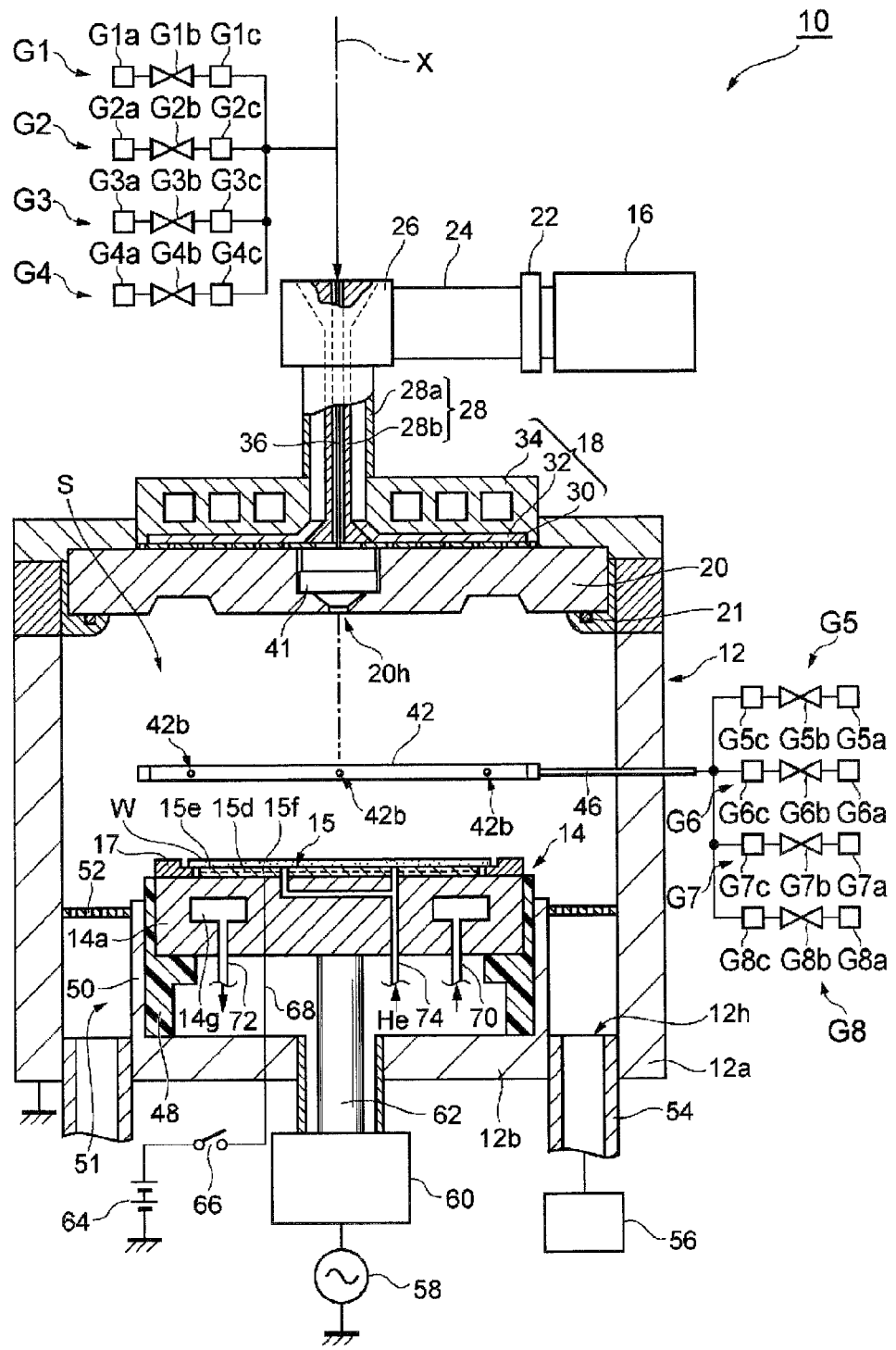
FIG. 3 is a view illustrating an example of a plasma processing apparatus which is used for the processing method illustrated in FIG. 1.

Referring back to FIG. 1, in step S1 illustrated in FIG. 1, the base body W to be processed is prepared in a processing chamber. Hereinafter, an example of a plasma processing apparatus which is used for the method for processing a base body to be processed according to an exemplary embodiment will be described. FIG. 3 is a view illustrating an example of a plasma processing apparatus which is used for the processing method illustrated in FIG. 1.

A plasma processing apparatus 10 illustrated in FIG. 3 includes a processing chamber 12, a stage 14, a microwave generator 16, an antenna 18, and a dielectric window 20. The plasma processing apparatus 10 is a microwave plasma processing apparatus which generates plasma by a microwave from the antenna 18.

In the processing chamber 12, processing spaces S in which the plasma processing is performed on the base body W to be processed are divided. The processing chamber 12 may include side walls 12a and a bottom portion 12b. The side wall 12a has a substantially cylindrical shape which extends in an axial line X direction (that is, an extending direction of an axial line X). The bottom portion 12b is formed at a lower end of the side wall 12a. An exhaust hole 12h for exhaustion is formed on the bottom portion 12b. An upper end of the side wall 12a is open.

The opening of the upper end of the side wall 12a is closed by the dielectric window 20. An O ring 21 is interposed between the dielectric window 20 and the upper end of the side wall 12a. The processing chamber 12 is more securely sealed by the O ring 21.

The microwave generator 16 generates a microwave of 2.45 GHz, for example. The plasma processing apparatus 10 further includes a tuner 22, a waveguide 24, a mode converter 26, and a coaxial waveguide 28.

The microwave generator 16 is connected to the waveguide 24 through the tuner 22. The waveguide 24 is, for example, a rectangular waveguide. The waveguide 24 is connected to the mode converter 26 and the mode converter 26 is connected to an upper end of the coaxial waveguide 28.

The coaxial waveguide 28 extends along an axial line X. The coaxial waveguide 28 includes an external conductor 28a and an internal conductor 28b. The external conductor 28a has a substantially cylindrical shape which extends in the axial line X direction. The internal conductor 28b is provided in the external conductor 28a. The internal conductor 28b has a substantially cylindrical shape which extends along the axial line X.

The microwave which is generated by the microwave generator 16 is guided to the mode converter 26 through the tuner 22 and the waveguide 24. The mode converter 26 converts a mode of the microwave and supplies the microwave whose mode is converted to the coaxial waveguide 28. The microwave from the coaxial waveguide 28 is supplied to the antenna 18.

The antenna 18 radiates a microwave for exciting a plasma based on the microwave generated by the microwave generator 16. The antenna 18 includes a slot plate 30, a dielectric plate 32, and a cooling jacket 34.

The slot plate 30 is a slot plate which configures a radial line slot antenna. The slot plate 30 is configured by a conductive metallic disk. A plurality of slot pairs is formed on the slot plate 30. Each slot pair includes two slots which extend in a direction intersecting or perpendicular to each other. The plurality of slot pairs is disposed in a radial direction with respect to the axial line X with a regular interval and also disposed in a circumferential direction with a regular interval.

The dielectric plate 32 is disposed between the slot plate 30 and a lower surface of the cooling jacket 34. The dielectric plate 32 is, for example, made of quartz and has a substantially disk shape. The surface of the cooling jacket 34 may be conductive. The cooling jacket 34 cools down the dielectric plate 32 and the slot plate 30. Therefore, a fluid channel for a refrigerant is formed in the cooling jacket 34. A lower end of the external conductor 28a is electrically connected to the upper surface of the cooling jacket 34. Further, a lower end of the internal conductor 28b is electrically connected to the slot plate 30 through a hole which is formed in centers of the cooling jacket 34 and the dielectric plate 32.

The microwave from the coaxial waveguide 28 is propagated to the dielectric plate 32 and introduced into the processing space S through the dielectric window 20 from the slot of the slot plate 30. The dielectric window 20 has a substantially disk shape and for example, is formed of quartz. The dielectric window 20 is provided between the processing space S and the antenna 18 and provided directly below the antenna 18 in the axial line X direction.

A conduit 36 passes through an inner hole of the internal conductor 28b of the coaxial waveguide 28. The conduit 36 extends along the axial line X and is connected to gas supply units G1, G2, G3, and G4. The gas supply unit G1 supplies gas including carbon and fluorine to the conduit 36. The gas including carbon and fluorine is for example, $CH_3F$ gas, $CF_4$ gas, or $CH_2F_2$ gas. The gas supply unit G1 may include a gas source G1a, a valve G1b, and a flow rate controller G1c. The gas source G1 is a gas source of gas including carbon and fluorine. The valve G1b switches between gas supply and stoppage of gas supply from the gas source G1a. The flow rate controller G1c is, for example, a mass flow controller and adjusts a flow rate of the gas from the gas source G1a.

The gas supply unit G2 supplies $H_2$ gas to the conduit 36. The gas supply unit G2 may include a gas source G2a, a valve G2b, and a flow rate controller G2c. The gas source G2a is a gas source of the $H_2$ gas. The valve G2b switches between gas supply and stoppage of gas supply from the gas source G2a. The flow rate controller G2c is, for example, a mass flow controller and adjusts a flow rate of the gas from the gas source G2a.

The gas supply unit G3 supplies Ar gas to the conduit 36. The gas supply unit G3 may include a gas source G3a, a valve G3b, and a flow rate controller G3c. The gas source G3a is a gas source of the Ar gas. The valve G3b switches between gas supply and stoppage of gas supply from the gas source G3a. The flow rate controller G3c is, for example, a mass flow controller and adjusts a flow rate of the gas from the gas source G3a.

The gas supply unit G4 supplies $N_2$ gas to the conduit 36. The gas supply unit G4 may include a gas source G4a, a valve G4b, and a flow rate controller G4c. The gas source G4a is a gas source of the $N_2$ gas. The valve G4b switches between gas supply and stoppage of gas supply from the gas source G4a. The flow rate controller G4c is, for example, a mass flow controller and adjusts a flow rate of the gas from the gas source G4a.

The plasma processing apparatus 10 further includes an injector 41. The injector 41 supplies gas from the conduit 36 to a through hole 20h which is formed in the dielectric window 20. The gas which is supplied to the through hole 20h of the dielectric window 20 is supplied to the processing space S.

The plasma processing apparatus 10 further includes a conduit 42. The conduit 42 supplies the gas from the circumference of the axial line X to the processing space S between the stage 14 and the dielectric window 20. The conduit 42 annularly extends around the axial line X between the dielectric window 20 and the stage 14. A plurality of gas supplying holes 42b is formed in the conduit 42. The plurality of gas supplying holes 42b is annularly arranged, is open to the axial line X, and supplies the gas which is supplied to the conduit 42 toward the axial line X. The conduit 42 is connected to gas supply units G5, G6, G7, and G8 through the conduit 46.

The gas supply unit G5 supplies the same type of gas as that of the gas supply unit G1, that is, gas including carbon and fluorine to the conduit 42. The gas supply unit G5 may include a gas source G5a, a valve G5b, and a flow rate controller G5c which are the same components as those of the gas supply unit G1. The gas supply unit G6 supplies the same type of gas as that of the gas supply unit G2, that is, $H_2$ gas to the conduit 42. The gas supply unit G6 may include a gas source G6a, a valve G6b, and a flow rate controller G6c which are the same components as those of the gas supply unit G2. The gas supply unit G7 supplies the same type of gas as that of the gas supply unit G3, that is, Ar gas to the conduit 42. The gas supply unit G7 may include a gas source G1a, a valve G7b, and a flow rate controller G1c which are the same components as those of the gas supply unit G3. The gas supply unit G8 supplies the same type of gas as that of the gas supply unit G4, that is, $N_2$ gas to the conduit 42. The gas supply unit G8 may include a gas source G8a, a valve G8b, and a flow rate controller G8c which are the same components as those of the gas supply unit G4.

The stage 14 is provided so as to face the dielectric window 20 in the axial line X direction. The stage 14 is provided such that the processing space S is provided between the dielectric window 20 and the stage 14. The base body W to be processed is disposed on the stage 14. The stage 14 may include a stand 14a, an electrostatic chuck 15, and a focus ring 17.

The stand 14a is supported by a cylindrical support 48. The cylindrical support 48 is formed of an insulating material and extends upwardly from the bottom portion 12b in a vertical direction. A conductive cylindrical support 50 is provided at an outer circumference of the cylindrical support 48. The cylindrical support 50 extends upwardly from the bottom portion 12b of the processing chamber 12 in the vertical direction along the outer circumference of the cylindrical support 48. An annular exhaust passage 51 is formed between the cylindrical support 50 and the side wall 12a.

An annular baffle plate 52 having a plurality of through holes is attached onto an upper portion of the exhaust passage 51. An exhausting device 56 is connected to a lower portion of an exhaust hole 12h through an exhaust pipe 54. The exhausting device 56 includes a vacuum pump such as a turbo molecular pump. A pressure of the processing space S in the processing chamber 12 may be depressurized to a predetermined degree of vacuum by the exhausting device 56.

The stand 14a also serves as a high frequency electrode. An RF bias high frequency power supply 58 is electrically connected to the stand 14a through a matching unit 60 and a power feeding rod 62. The high frequency power supply 58 outputs a high frequency power having a predetermined frequency, for example, 13.65 MHz, which is suitable for controlling energy of ion which is induced in the base body W to be processed with a predetermined power. The matching unit 60 accommodates a matcher which matches impedance at the high frequency power supply 58 side and impedance at a load side, such as an electrode, plasma, and the processing chamber 12. A self-bias generating blocking capacitor is included in the matching box.

The electrostatic chuck 15 which is a retaining member which retains the base body W to be processed is provided on a top surface of the stand 14a. The electrostatic chuck 15 retains the base body W to be processed by an electrostatic adsorption force. The focus ring 17 which annularly encloses the circumference of the base body W to be processed and the circumference of the electrostatic chuck 15 is provided at an outer side in a radial direction of the electrostatic chuck 15.

The electrostatic chuck 15 includes an electrode 15d, an insulating layer 15e, and an insulating layer 15f. The electrode 15d is configured by a conductive layer and provided between the insulating layer 15e and the insulating layer 15f. A high voltage direct current power supply 64 is electrically connected to the electrode 15d through a switch 66 and a coated wire 68. The electrostatic chuck 15b may retain the base body W to be processed by a coulomb force which is generated by a direct current voltage which is applied from the direct current power supply 64.

An annular refrigerant chamber 14g which circumferentially extends is provided in the stand 14a. A refrigerant at a predetermined temperature, for example, cooling water, which is provided from a chiller unit (not illustrated) through pipes 70 and 72 is circulated to be supplied into the refrigerant chamber 14g. A processing temperature of the base body W to be processed on the electrostatic chuck 15 may be controlled by the temperature of the refrigerant. Further, in the plasma processing apparatus 10, heat transfer gas, for example, He gas is supplied between a top surface of the electrostatic chuck 15 and a rear surface of the base body W to be processed through a gas supply pipe 74.

In the plasma processing apparatus 10 configured as described above, the gas is supplied from the through hole 20h of the dielectric window 20 into the processing space S along the axial line X through the conduit 36 and the through hole 41h of the injector 41. Further, the gas is supplied from the conduit 42 toward the axial line X below the through hole 20h. Further, the microwave is introduced into the processing space S through the dielectric window 20 from the antenna 18. By doing this, the plasma is generated in the processing space S. As described above, according to the plasma processing apparatus 10, the plasma may be generated without applying a magnetic field. In this plasma processing apparatus 10, the base body W to be processed which is disposed on the stage 14 may be processed by the plasma of the gas which is supplied to the processing space S.

Referring back to FIG. 1, in step S1 illustrated in FIG. 1, the base body W to be processed is disposed on the stage 14, that is, on the top surface of the electrostatic chuck 15. Continuously, in step S2, a layer containing silicon nitride, that is, the second side wall spacer layer 112 is etched. The second side wall spacer layer 112 is partially or completely removed by the etching in step S2.

In step S2, the gas including carbon and fluorine is supplied to the processing chamber 12 from the gas supply units G1 and G5 of the plasma processing apparatus 10 and the plasma is generated in the processing chamber 12. In the plasma processing apparatus 10, the microwave is introduced into the processing space S through the dielectric window 20 from the antenna 18 as an excitation source of the plasma. Therefore, the plasma is generated in the processing space S in the processing chamber 12. In one exemplary embodiment, in step S2, the $H_2$ gas may be supplied from the gas supply units G2 and G6 to the processing space S. Further, in one exemplary embodiment, in step S2, the Ar gas may be supplied from the gas supply units G3 and G7 to the processing space S.

In step S2, the gas which is supplied to the processing space configures a first processing gas. As described above, in step S2, the first processing gas which is supplied into the processing chamber 12 does not contain oxygen. Therefore, in step S2, it is possible to suppress the generation of a residue including Ni. Further, the $H_2$ gas which is supplied in step S2 is combined with fluorine contained in the first processing gas so that the silicon may be suppressed from being excessively etched by fluorine. In the meantime, in one exemplary embodiment, $NH_3$ gas may be supplied instead of $H_2$ gas.

Here, an example of processing conditions when the step S2 is performed by the plasma processing apparatus 10 will be described below.

Pressure of processing space S: 100 mTorr (13.33 Pa)
Power from high frequency power supply 58: 30 W
Power of microwave generator 16: 1800 W
Flow rate of first processing gas
Ar gas: 1000 sccm
$CH_3F$ gas: 6 sccm
$H_2$ gas: 30 sccm
Ratio of flow rates of gas from conduit 36 and gas from conduit 42 (flow rate of gas from conduit 36: flow rate of gas from conduit 42): 95:5
Processing time: 300 seconds In a method for processing a base body to be processed according to an exemplary embodiment, in next step S3, the residue from the based body W to be processed which is etched in step S2 is removed. The residue which is removed in step S3 is derived from carbon and fluorine which are included in the first processing gas used in step S2. That is, the residue is a compound including carbon and fluorine. In step S3, the etched base body W to be processed is disposed on the stage 14 and a second processing gas which includes nitrogen and hydrogen but does not contain oxygen is supplied into the processing chamber 12 and further the plasma is generated in the processing chamber 12.

In one exemplary embodiment, in step S3, the $H_2$ gas is supplied from the gas supply units G2 and G6 into the processing chamber 12 and $N_2$ gas is supplied from the gas supply units G4 and G8 into the processing chamber 12. Further, in step S3, the microwave is introduced into the processing space S through the dielectric window 20 from the antenna 18. Therefore, the plasma is generated in the processing space S in the processing chamber 12. By the processing in step S3, a nitrogen radical and a hydrogen radical are generated in the processing chamber 12. The nitrogen radical is combined with carbon which is included in the residue and the hydrogen radical is combined with fluorine which is included in the residue. Therefore, by step S3, the residue on the base body W to be processed is removed. Further, also in step S3, a second processing gas which does not contain oxygen is used to suppress the residue including Ni from being generated.

In one exemplary embodiment, step S3 may be performed without withdrawing the base body W to be processed from the processing chamber 12 after performing step S2. Therefore, it is possible to suppress oxygen from entering the processing chamber 12. As a result, it is possible to more efficiently suppress the residue including Ni from being generated.

Hereinafter, an example of processing conditions when step S3 is performed by the plasma processing apparatus 10 will be described below.

Figure 4:
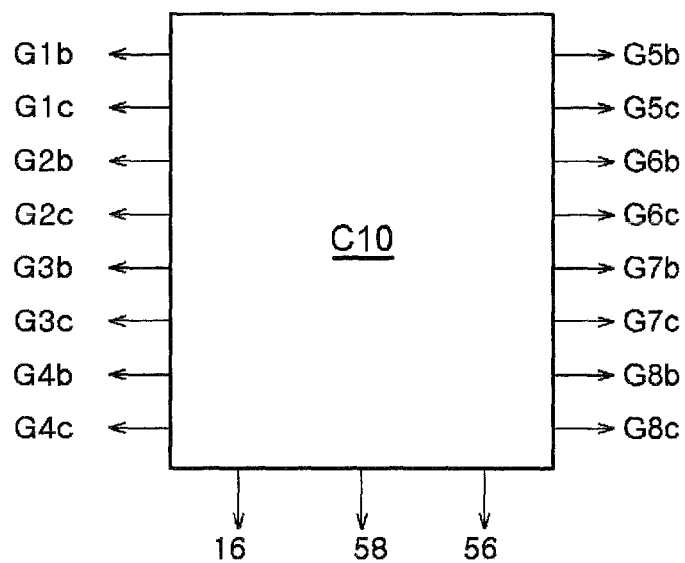
FIG. 4 is a view illustrating a control unit which may be provided in the plasma processing apparatus illustrated in FIG. 3.

Pressure of processing space S: 20 mTorr (2.666 Pa)
Power from high frequency power supply 58: 0 W
Power of microwave generator 16: 2000 W
Flow rate of second processing gas
$N_2$ gas: 200 sccm
$H_2$ gas: 200 sccm
Ratio of flow rates of gas from conduit 36 and gas from conduit 42 (flow rate of gas from conduit 36: flow rate of gas from conduit 42: 100:0
Processing time: 15 seconds Hereinafter, refer to FIG. 4. FIG. 4 is a view illustrating a control unit which may be provided in the plasma processing apparatus illustrated in FIG. 3. In one exemplary embodiment, the plasma processing apparatus 10 may further include a control unit C10. The plasma processing apparatus 10 may perform the above-described steps S2 and S3 under the control by the control unit C10. The control unit C10 may be a computer including components such as a CPU and a memory or may apply a control signal to individual components of the plasma processing apparatus 10 in accordance with a program stored in the memory.

More specifically, in step S2, the control unit C10 may apply control signals to the valve G1b, the flow rate controller G1c, the valve G2b, the flow rate controller G2c, the valve G3b, the flow rate controller G3c, the valve G5b, the flow rate controller G5c, the valve G6b, the flow rate controller G6c, the valve G7b, and the flow rate controller G1c to supply the first processing gas to the processing chamber 12. Further, in step S2, the control unit C10 may apply the control signal to the microwave generator 16 to supply the microwave into the processing chamber 12. Further, in step S2, the control unit C10 may apply the control signal to the high frequency power supply 58 to adjust a power from the high frequency power supply 58 and apply the control signal to the exhausting device 56 to adjust a degree of vacuum of the processing space S in the processing chamber 12.

In step S3, the control unit C10 may apply control signals to the valve G2b, the flow rate controller G2c, the valve G4b, the flow rate controller G4c, the valve G6b, the flow rate controller G6c, the valve G8b, and the flow rate controller G8c to supply the second processing gas to the processing chamber 12. Further, in step S2, the control unit C10 may apply the control signal to the microwave generator 16 to supply the microwave into the processing chamber 12. Furthermore, in step S2, the control unit C10 may apply the control signal to the high frequency power supply 58 to adjust a power from the high frequency power supply 58 and apply the control signal to the exhausting device 56 to adjust a degree of vacuum of the processing space S in the processing chamber 12.

Figure 5:
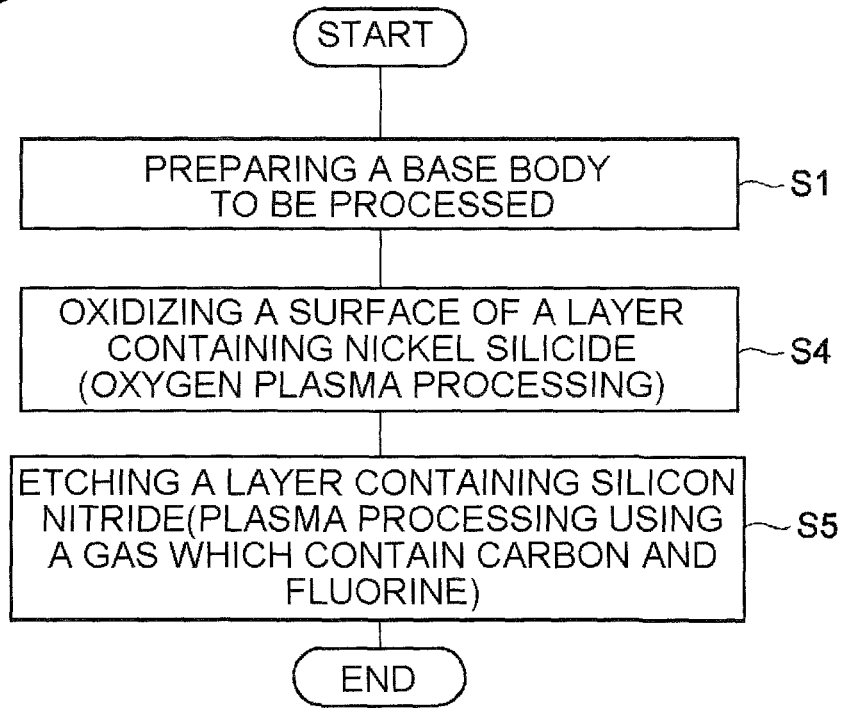
FIG. 5 is a flowchart illustrating a method for processing a base body to be processed according to another exemplary embodiment.

Hereinafter, another exemplary embodiment will be described. FIG. 5 is a flowchart illustrating a method for processing a base body to be processed according to an exemplary embodiment. In the method for processing a base body to be processed according to the exemplary embodiment illustrated in FIG. 5, similarly to step S1 of FIG. 1, first, a base body to be processed is prepared in a processing chamber. In one exemplary embodiment, the base body to be processed may be the base body W to be processed illustrated in FIG. 2. Further, in one exemplary embodiment, the same plasma processing apparatus as the plasma processing apparatus 10 illustrated in FIG. 3 may be used. However, in the method for processing a base body to be processed according to the exemplary embodiment illustrated in FIG. 5, oxygen gas, for example, $O_2$ gas is supplied as a gas which is supplied from gas supply units G2 and G6 or gas supply units G4 and G8.

Continuously, in the method for processing a base body to be processed according to the exemplary embodiment illustrated in FIG. 5, in step S4, an oxidation processing is performed on the base body W to be processed. In step S4, oxygen plasma is generated in the processing chamber so that surfaces of layers containing nickel silicide, for example, layers 116 and 118 of the base body W to be processed are oxidized. In one exemplary embodiment, in step S4, the oxygen gas is supplied from the gas supply units G2 and G4 or G6 and G8 into the processing chamber 12 and the plasma is generated in the processing chamber 12. Further, in one exemplary embodiment, in step S4, the Ar gas may be supplied from the gas supply units G3 and G7 to the processing space S.

Here, an example of processing conditions when the step S4 is performed by the plasma processing apparatus 10 will be described below.

Pressure of processing space S: 20 mTorr to 100 mTorr
Power from high frequency power supply 58: 0 to 100 W
Power of microwave generator 16: 3 kW (13.56 MHz)
Flow rate of first processing gas
Flow rate of supplied gas
Oxygen gas ($O_2$ gas): 350 sccm, or
Oxygen gas ($O_2$ gas): 350 sccm, Ar gas: 350 sccm
Processing time: 30 seconds Continuously, in the method for processing a base body to be processed according to the exemplary embodiment illustrated in FIG. 5, in step S5, a layer containing silicon nitride, for example, the second side wall spacer layer 112 is etched. The second side wall spacer layer 112 is partially or completely removed by the etching in step S5.

In step S5, the gas including carbon and fluorine is supplied to the processing chamber 12 from the gas supply units G1 and G5 of the plasma processing apparatus 10 and the plasma is generated in the processing chamber 12. Further, in step S5, the Ar gas may be supplied from the gas supply units G3 and G7 to the processing space S.

Here, an example of processing conditions when the step S5 is performed by the plasma processing apparatus 10 will be described below.

Pressure of processing space S: 100 mTorr (13.33 Pa)
Power from high frequency power supply 58: 30 W
Power of microwave generator 16: 1800 W
Flow rate of supplied gas
Ar gas: 1000 sccm
$CH_3F$ gas or $CH_2F_2$ gas: 6 sccm
Ratio of flow rates of gas from conduit 36 and gas from conduit 42 (flow rate of gas from conduit 36: flow rate of gas from conduit 42): 95:5

In the method for processing a base body to be processed of FIG. 5 described above, before etching the layer containing silicon nitride, for example, the layer 112, the surfaces of the layers containing nickel silicide, for example, the layers 116 and 118 are oxidized so that the residue derived from Ni which is included in the layer containing nickel silicide is suppressed from being generated when the layer containing silicon nitride is etched.

Even though various exemplary embodiments have been described above, the present invention is not limited to the above-described exemplary embodiments and various modifications may be allowed. For example, the plasma processing apparatus which may be used for the method for processing a base body to be processed according to an exemplary embodiment is not limited to the microwave plasma processing apparatus, but arbitrary plasma processing apparatus such as a parallel plate type plasma processing apparatus may be used.

| [Explanation of Symbols] | |
| --- | --- |
| 10: Plasma processing apparatus | 12: Processing chamber |
| 14: Stage | 16: Microwave generator |
| 18: Antenna | 20: Dielectric window |
| 28: Coaxial waveguide | 30: Slot plate |
| 32: Dielectric plate | 34: Cooling jacket |
| 36: Conduit | 41: Injector |
| 42: Conduit | 56: Exhausting device |
| 58: High frequency power supply | C10: Control unit |
| G1 to G8: Gas supply unit | W: Base body to be processed |
| 100: Substrate | 102: Insulating film |
| 104: Gate electrode | 108: Lightly diffused region |
| 110: First side wall spacer layer | |
| 112: Second side wall spacer layer (Layer containing silicon nitride) | |
| 114: Highly diffused region | 116, 118: Nickel silicide layer |

The invention claimed is:

1. A method for processing a base body to be processed, the method comprising:
   providing a plasma processing apparatus including a first conduit which extends along an axial line of a processing chamber and supplies a processing gas into a processing space of the processing chamber along the axial line, and a second conduit which annularly extends around the axial line and supplies the processing gas from a circumference of the axial line to the processing space of the processing chamber;
   preparing a base body to be processed having a first layer containing nickel silicide and a second layer containing silicon nitride in the processing chamber;
   supplying a first processing gas, which contains hydrofluorocarbon gas and argon gas but does not contain oxygen gas, into the processing space of the processing chamber through the first and second conduits and generating plasma of the first processing gas in the processing chamber thereby etching the second layer; and
   after etching the second layer, supplying a second processing gas into the processing space of the processing chamber through the first and second conduits and generating plasma of the second processing gas in the processing chamber thereby removing a residue from the base body to be processed,
   wherein the second processing gas contains nitrogen gas and hydrogen gas but does not contain oxygen gas,
   wherein in the etching of the second layer, a ratio of a flow rate of the first processing gas ejected from the first conduit over a flow rate of the first processing gas ejected from the second conduit is 95:5, and
   wherein in the removing of a residue from the base body to be processed, a ratio of a flow rate of the second processing gas ejected from the first conduit over a flow rate of the second processing gas ejected from the second conduit is 100:0.

2. The method of claim 1, wherein after the etching, the removing of the residue is performed without withdrawing the base body to be processed from the processing chamber.

3. The method of claim 1, wherein the second processing gas includes $H_2$ gas and $N_2$ gas.

4. The method of claim 1, wherein a ratio of the hydrofluorocarbon gas to the argon gas is 1% or less.

5. The method of claim 1, wherein when the hydrofluorocarbon gas is CHxFy, x≥y and y≥1.

6. The method of claim 1, wherein in the etching, a flow rate of the argon gas is 1000 sccm.

7. The method of claim 1, wherein in the etching, a pressure of the processing space is 100 mTorr.

8. A method for processing a base body to be processed, the method comprising:

providing a plasma processing apparatus including a first conduit which extends along an axial line of a processing chamber and supplies a processing gas into a processing space of the processing chamber along the axial line, and a second conduit which annularly extends around the axial line and supplies the processing gas from a circumference of the axial line to the processing space of the processing chamber;

preparing a base body to be processed, which includes a first layer containing nickel silicide and a second layer containing silicon nitride in the processing chamber;

oxidizing a surface of the first layer in the processing chamber;

supplying a first processing gas containing hydrofluorocarbon gas and argon gas into the processing space of the processing chamber through the first and second conduits and generating plasma of the first processing gas in the processing chamber thereby etching the second layer; and after etching the second layer, supplying a second processing gas into the processing space of the processing chamber through the first and second conduits and generating plasma of the second processing gas in the processing chamber thereby removing a residue from the base body to be processed, wherein the second processing gas contains nitrogen gas and hydrogen gas but does not contain oxygen gas, wherein, in the etching of the second layer, a ratio of a flow rate of the first processing gas ejected from the first conduit over a flow rate of the first processing gas ejected from the second conduit is 95:5, and wherein, in the removing of a residue from the base body to be processed, a ratio of a flow rate of the second processing gas ejected from the first conduit over a flow rate of the second processing gas ejected from the second conduit is 100:0.

\* \* \* \* \*